(12) United States Patent
Kim et al.

(10) Patent No.: US 7,561,861 B2
(45) Date of Patent: *Jul. 14, 2009

(54) TUNING CIRCUIT

(75) Inventors: Seyeob Kim, Gyeonggi-do (KR); Minsu Jeong, Gyeonggi-do (KR)

(73) Assignee: Integrant Technologies Inc., Gyeonggi-Do (KR)

( * ) Notice: Subject to any disclaimer, the term of this patent is extended or adjusted under 35 U.S.C. 154(b) by 420 days.

This patent is subject to a terminal disclaimer.

(21) Appl. No.: 11/432,561

(22) Filed: May 12, 2006

(65) Prior Publication Data

US 2006/0256486 A1    Nov. 16, 2006

(30) Foreign Application Priority Data

May 12, 2005   (KR) ...................... 10-2005-0039876

(51) Int. Cl.
*H04B 1/16* (2006.01)
(52) U.S. Cl. ..................... 455/195.1; 455/307; 327/553
(58) Field of Classification Search ....................... None
See application file for complete search history.

(56) References Cited

U.S. PATENT DOCUMENTS

| | | | | |
|---|---|---|---|---|
| 4,760,535 A | * | 7/1988 | Englmeier | ............... 455/197.1 |
| 5,945,889 A | * | 8/1999 | Shanthi-Pavan et al. | .... 333/17.1 |
| 2004/0169565 A1 | | 9/2004 | Gaggl et al. | |

* cited by examiner

*Primary Examiner*—Thanh C Le
(74) *Attorney, Agent, or Firm*—Foley & Lardner LLP

(57) ABSTRACT

A tuning circuit of a filter is disclosed to correct a cut-off frequency of the filter. The tuning circuit comprises a current generation unit which includes a first transistor and a resistor, and a capacitor compensation unit which includes a second transistor and a capacitor unit.

7 Claims, 5 Drawing Sheets

TUNING CIRCUIT

This Nonprovisional application claims priority under 35 U.S.C. § 119(a) on Patent Application No. 10-2005-0039876 filed in Korea on May 12, 2005, the entire contents of which are hereby incorporated by reference.

BACKGROUND OF THE INVENTION

1. Field of the Invention

The present invention relates to a filter and, more particularly, to a tuning circuit of a filter for correcting a cut-off frequency of the filter.

2. Description of the Related Art

FIG. 1a shows a related art tuning circuit.

The tuning circuit as shown in FIG. 1a is disclosed in a U.S. Patent Laid Open Publication No. US 2004/0169565.

As shown in FIG. 1a, the tuning circuit comprises a filter unit 110, a comparator 120, and a controller unit 130.

The filter unit 110 comprises a first RC unit 111a, a second RC unit 111b, switches SW1a, SW1b, SW2a, and SW2b for charging and discharging the first and second RC units 111a and 111b, and a capacitor array 112 for controlling capacitance values of the first and second RC units 111a and 111b.

The comparator 120 compares two inputs (①and ②), and the controller unit 130 comprises a sequence controller 131 and a memory 132.

Herein, when a start signal is inputted to the sequence controller 131, the first and third switches SW1a and SW1b are turned on (close) according to a control signal (A) of an output terminal of the sequence controller 131. When a stop signal is inputted to the sequence controller 131, the second and fourth switches SW2a and SW2b are turned off (open) according to a control signal (B) of the output terminal of the sequence controller 131.

Although not shown, in order to perform a tuning operation, first, the first and third switches SW1a and SW1b should be turned on (close) and the second and fourth switches SW2a and SW2b should be turned off (open), so that the first capacitor (C1a) can be in a discharged state and the second capacitor (C1b) can be in a charged state.

After the proceeding process, when an input terminal start control signal of the sequence controller 131 is applied, the first and third switches SW1a and SW1b are turned off (open) and the second and fourth switches SW2a and SW2b are turned on (close), so that the first capacitor C1a is connected with a first resister R1a and gradually charged as time goes by and the second capacitor C1b is connected with a second resister R1b and gradually discharged as time goes by.

As the above process is performed, the comparator 120 compares a value of the first node (①) of the first RC unit 111a and the second node (②) of the second RC unit 111b.

Herein, upon comparing the values of the first and second nodes (① and ②), namely, the inputs to the comparator 120, if the output voltages of the first and second RC units 111a and 111b are reversed compared with an initial comparison state, the comparator 120 outputs a stop signal and the sequence controller 131 checks a corresponding time point and stores a clock time of a digital counter in the memory 132.

Resultantly, the first RC unit 111a has a first time constant (t1) and the second RC unit 111b has a second time constant (t2), and in this respect, the first and second capacitors C1a and C1b are controlled by the capacitor array 112 so that the first and second time constants t1 and t2 can become the same.

FIG. 1b is a graph for explaining the tuning operation of the related art tuning circuit. With reference to in FIG. 1b, as mentioned above with reference to FIG. 1a, the control signal (A) for starting tuning is turned off (open) and the control signal (B) is turned on (close), so that, at the start time point (tstart), the first RC unit starts to be charged while the second RC unit starts to be discharged.

Namely, the first time constant (t1) of the first RC unit is R1*C1 and the second time constant (t2) of the second RC unit is R2*C2.

As illustrated, time points at which the first and second RC units have the same charging and discharging change from Δt1 to Δt2 or to Δt3 at intersection nodes S1, S2, and S3 according to a device.

However, the related art method has the following problems. That is, because it does not use an external absolute reference that is not related to a change in PVT (Process, Voltage and Temperature), the tuned intersection nodes can be changed according to a change in the PVT.

In addition, since matching is performed according to a change in the first and second RC units, resultantly, tuning is made only at the intersection nodes S1, S2 or S3, so the tuning range is very narrow depending on a chip and every chip needs a tuning simulation.

SUMMARY OF THE INVENTION

The present invention has been made in an effort to provide a tuning circuit having advantages of compensating changed characteristics of a cut-off frequency generated as characteristics of a filter is changed by more than a certain range compared with characteristics of the filter set when the filter was initially designed.

The present invention has been also made in an effort to provide a tuning circuit having advantages of maximizing an effect of tuning by performing tuning at a period of a clock that is not related to an external change.

The present invention has been also made in an effort to provide a tuning circuit in which every chip has a uniform R*C value by performing tuning at a period of a clock that is not related to an external change regardless of a type of a chip.

An exemplary embodiment of the present invention provides a tuning circuit comprising: a current generation unit comprising a first transistor having three terminals and changing a current flowing from a second terminal to a third terminal in proportion to a voltage applied to a first terminal, and a resistor being connected in series with the first transistor, a current flowing at the resistor being changed according to a resistance of the resistor; and a capacitor compensation unit comprising a second transistor having three terminals and constituting a current-mirror circuit together with the second transistor in which a mirror-current flows from a fifth terminal to a sixth terminal in proportion to a voltage applied to a forth terminal, a capacitor unit being connected with the sixth terminal of the second transistor and varying capacitance (C) of a capacitor with an time constant (RC), and an up-down counter unit for transmitting a control signal to vary the capacitance of the capacitor unit.

Herein, the current generation unit further comprises a first comparator for comparing a voltage applied to both ends of the resistor and a reference voltage and outputting it, and in this case, the output of the first comparator can be applied to the first terminal of the first transistor.

Herein, as for the resistor of the current generation unit, two or more resistors can be connected in parallel and one of them can be activated by a control mode clock signal according to a broadband frequency.

Herein, the capacitor compensation unit further comprises a second comparator for comparing an output voltage and a reference voltage and outputting a signal of a comparison value, and in this case, the output signal of the second comparator can be applied as an input signal of the up-down counter unit.

Herein, the capacitor unit comprises a plurality of capacitors connected in parallel and each capacitor is connected with each switch, forming a switching capacitor structure, and the switches can be controlled by a digital 4-bit control signal of the up-down counter unit.

Herein, the tuning circuit further comprises a first switch being connected between an output terminal of the capacitor compensation unit and a ground, a second switch being connected between the sixth terminal of the second transistor and the output terminal of the capacitor compensation unit and a third switch being connected between an input terminal of the second comparator and an output terminal of the capacitor compensation unit.

Herein, the first to third switches are controlled by clock signal, and when the first switch is turned on by the clock signal, the second and third switches can be sustained in an OFF state, when the second switch is turned on by the clock signal, the first and third switches can be sustained in an OFF state, and when the third switch is turned on by the clock signal, the first and second switches can be sustained in an OFF state.

The present invention is not limited to the embodiments disclosed hereinafter and can be modified into various forms, and like reference numerals designate like elements throughout the specification.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1b is a graph for explaining a tuning operation of the related art tuning circuit in FIG 1a.

DETAILED DESCRIPTION OF THE PREFERRED EMBODIMENT

The preferred embodiment of the present invention will be described in detail with reference to the accompanying drawings.

Figure 1A:
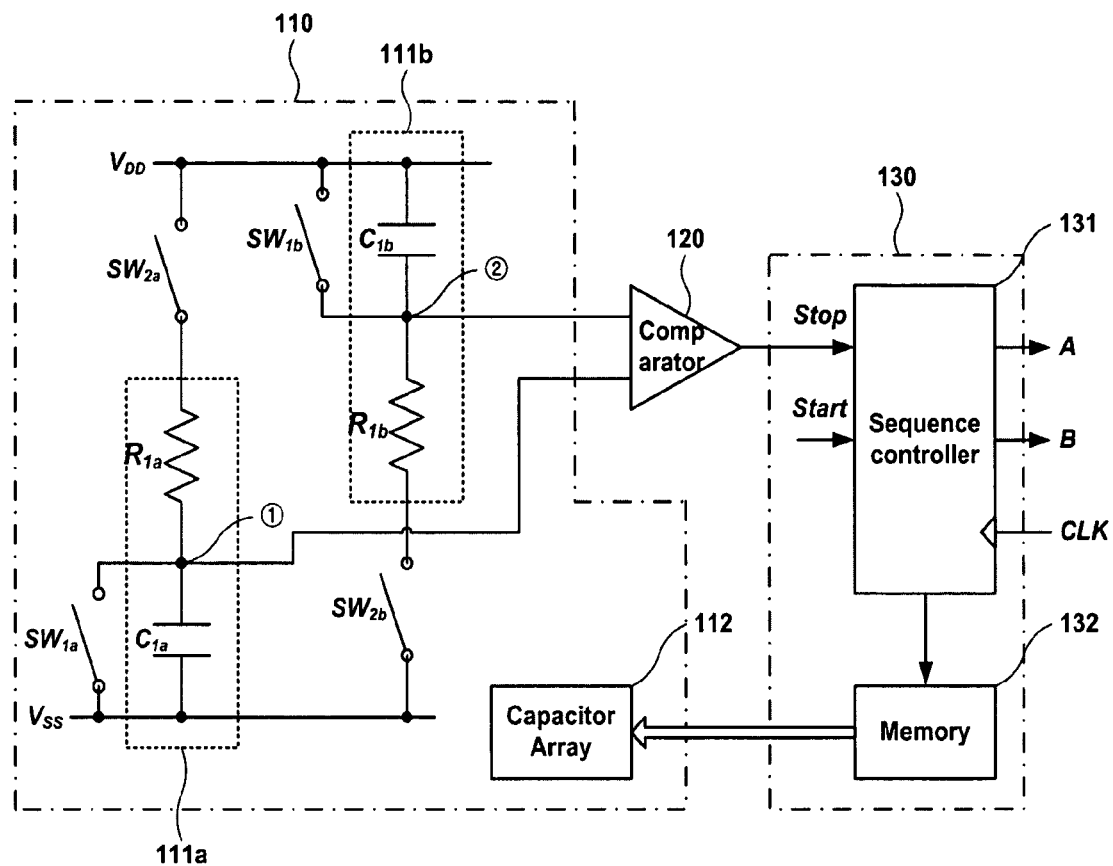
FIG. 1a is a circuit diagram showing a tuning circuit according to a related art.
Figure 1B:
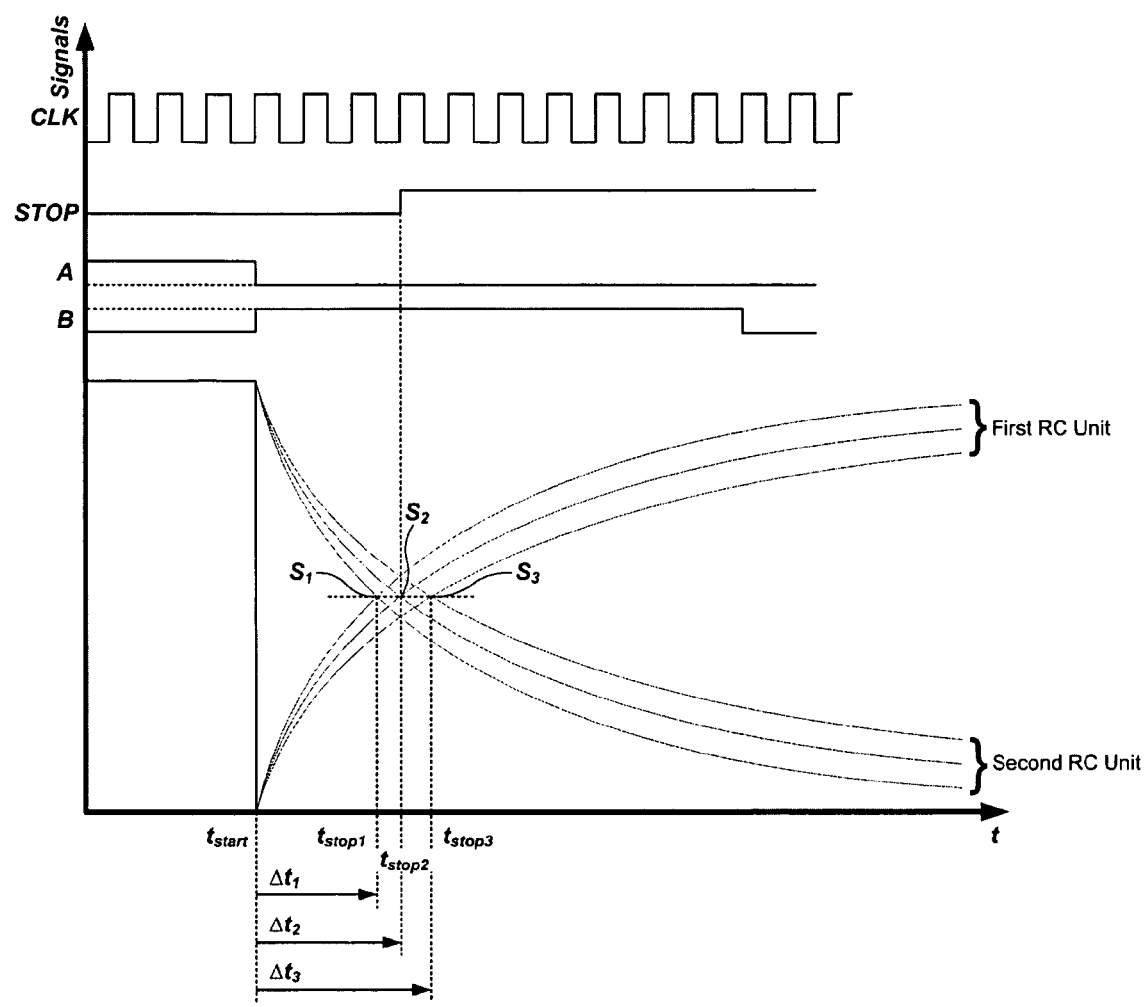
Figure 2:
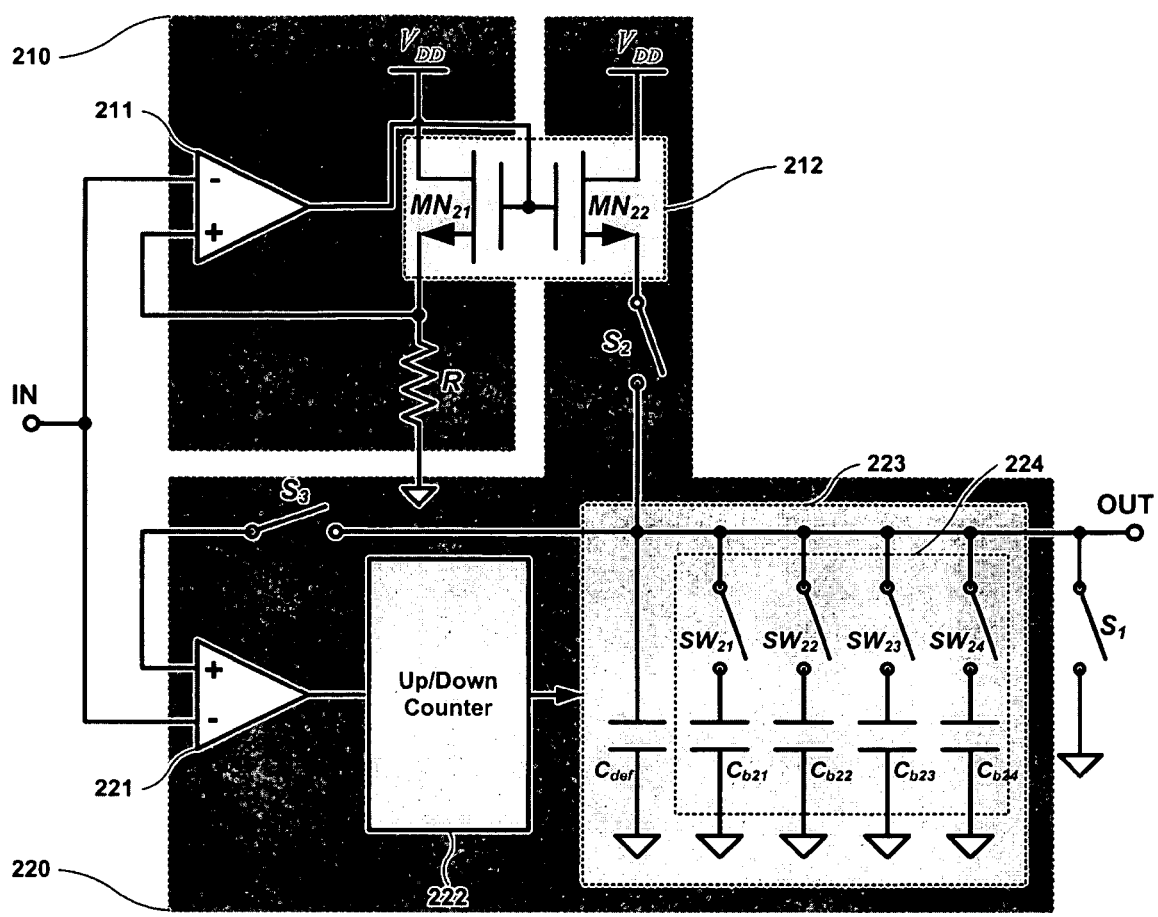
FIG. 2 is a tuning circuit diagram for compensating a change in a cut-off frequency of a filter according to an exemplary embodiment of the present invention.

FIG. 2 is a tuning circuit diagram for compensating a change in a cut-off frequency of a filter according to an exemplary embodiment of the present invention.

As shown in FIG. 2, the tuning circuit comprises a current generation unit 210 and a capacitor compensation unit 220.

In the current generation unit 210, a current flowing at a resistor (R) changes according to a resistance value (R), and the capacitor compensation unit 220 compensates a time constant of a cut-off frequency by compensating a component of capacitance (C) based on the current generated from the current generation unit 210.

The current generation unit 210 comprises a first comparator 211 having two input terminals and one output terminal, a first transistor MN21 having three terminals, and the resistor (R).

The capacitor compensation unit 220 comprises the second comparator 221 having two input terminals and one output terminals, a second transistor MN22 having three terminals, an up/down counter unit 222, a capacitor unit 223, a first switch S1, a second switch S2, and a third switch S3.

Herein, the first transistor MN21 of the current generation unit 210 and the second transistor MN22 of the capacitor compensation unit 220 constitute a current mirror circuit 212 so that amount of a current flow corresponding to the first transistor MN21 flows at the second transistor MN22 of the capacitor compensation unit 220.

A connection structure of respective elements will now be described.

In the current generation unit 210, an input signal is applied to the first terminal (−) of the first comparator 211, an output of the first comparator 211 is connected with the first terminal of the first transistor MN21, a voltage (VDD) is applied to the second terminal of the first transistor MN21, and the second terminal of the first transistor MN21 is connected with the resistor (R) and the second terminal (+) of the first comparator (211).

In the capacitor compensation unit 220, an input signal is applied to the second terminal (−) of the second comparator 221, an output of the second comparator 221 is inputted to the up/down counter unit 222, the first terminal of the first transistor MN21 is connected with the first terminal of the second transistor MN22 are connected with each other to constitute the current-mirror circuit 212, the second terminal of the second transistor MN22 is applied to the voltage (VDD), the third terminal of the second transistor MN22 is connected with one end of the second switch S2 comprising two terminals and the other end of the second switch S2 is connected with an output terminal (OUT), one end of the capacitor unit 223, and the first terminal (+) of the second comparator 221.

The output terminal (OUT) is connected with the first switch S1 comprising two terminals and the third switch S3 comprising two terminals.

The capacitor unit 223 comprises a basic capacitor (Cdef) and a switching capacitor-bank 224. An input terminal of the capacitor unit 223 is connected with one end of the basic capacitor (Cdef).

In the switching capacitor-bank 224, a first terminal of each of the switches SW21 to SW24 each comprised of two terminals is connected with the input terminal of the capacitor unit 223, a second terminal of each of the switches SW21 to SW24 is connected with one end of each of the capacitors Cb21 to Cb24, the switches SW21 to SW24 are switched on or off by a control signal of the up/down counter unit 222, and whether to activate the capacitors Cb21 to Cb24 is determined according to an ON/OFF operation of the ON/OFF switches SW21 to SW24.

Herein, as for the resistor (R) of the current generation unit 210, two or more resistors can be connected in parallel to set various resistance values.

In addition, the switching capacitor-bank 224 is constructed such that a first switching capacitor comprises the switch SW21 and the capacitor Cb21 and likewise, the second to fourth switches capacitors are formed with the same structure by comprising the switches SW22 to SW24 and the capacitors Cb22 to Cb24, respectively. The first to fourth switching capacitors are connected in parallel to form the switching capacitor-bank 224.

The operation of the present invention will be described as follows.

When a reference voltage (Vref) is applied to the input terminal (IN), the first switch S1 is turned on (close), and after electric charges charged in the capacitor unit 223 are all discharged, the first switch S1 is turned off (open).

When the first switch S1 is turned off, the second switch S2 is simultaneously turned on, and at this time, the third switch S3 is in an initial OFF state, without being switched.

The reference voltage is applied to the first input terminal (−) of the first comparator 211 of the current generation unit 210, and an output of the first comparator 211 is applied to the first terminal (gate) of the first transistor MN21.

When a voltage is applied to the second terminal (drain) of the first transistor MN21, a current (I) flows to the third terminal (source) of the first transistor MN21.

When the current (I) flows to the third terminal (source) of the first transistor MN21, it is applied to the resistor (R) and the second input terminal (+) of the first comparator 211.

The first comparator 211 compares the inputted reference voltage (Vref) and a voltage (IR) generated as the current (I) flows to the resistor (R), and an amplifying operation of the first transistor MN21 is increased or decreased to reduce or increase the current (I) so as not to make a difference between the reference voltage (Vref) and the voltage (IR) generated from the resistor (R).

Herein, the cut-off frequency (fc) has the properties that it is in inverse proportion to the product of the resistor and the capacitor and can be expressed by equation (1) shown below:

$$f_c \propto \frac{1}{RC} \qquad \text{[Equation 1]}$$

wherein fc is a cut-off frequency, 'R' is resistance, and 'C' is capacitance.

Namely, in the present invention, even if the component of the resistance changes according to a variation in a production process, because the variation does not occur frequently, the cut-off frequency can be corrected by correcting the capacitance.

Resultantly, regarding the current (I) generated at the current generation unit 210, by virtue of the current-mirror circuit 212, the amount of the current (I) flowing at the third terminal (source), flows at the third terminal (source) of the second transistor MN22 of the capacitor compensation unit 220.

The thusly generated current (I) of the capacitor compensation unit 220 flows at the basic capacitor (Cdef) of the capacitor unit 223.

Herein, the voltage (Vout) generated from the basic capacitor (Cdef) can be expressed by equation (2) shown below:

$$V_{out} = \frac{Q}{C} \qquad \text{[Equation 2]}$$
$$= \frac{t \times I}{C}$$

wherein Vout is an output voltage, 'Q' is an amount of charges, 'C' is capacitance, 'I' is a current flowing at the capacitor, and 't' is time during which the current flows at the capacitor.

The voltage Vout, which is generated as the current (I) continuously flows to the basic capacitor (Cdef) during a certain time, is applied to the first input terminal of the second comparator 221 of the capacitor compensation unit 220 and the reference voltage Vref is applied to the second input terminal.

An output of the second comparator 221 is applied to the up/down counter unit 222, and the up/down counter unit 222 turns on or off the switches of the switching capacitor-bank 224 of the capacitor unit 223.

In other words, the up/down counter unit 222 switches the first to fourth switches SW21 to SW24 of the switching capacitor-bank 224 of the capacitor unit 223 according to the received voltage. Then, a current flows to the capacitors Cb21 to Cb24 corresponding to respective switches SW21 to SW2, thereby controlling the total amount of electric charges of the switching capacitor-bank.

Herein, when the total capacitance of the capacitor unit 223 is 'C', since the current (I) is obtained by dividing the reference voltage Vref by the resistance (R), the output voltage can be expressed by equation (3) to equation (5) related to a time constant shown below:

$$V_{out} = \frac{t \times \frac{V_{ref}}{R}}{C} \qquad \text{[Equation 3]}$$

wherein because Vref should be equal to Vout, if the reference voltage Vref and the output voltage Vout are the same, the Vref can be expressed by equation (4) shown below:

$$V_{ref} = \frac{t \times \frac{V_{ref}}{R}}{C} \qquad \text{[Equation 4]}$$

Resultantly, equation (4) can be expressed by equation (5) shown below:

$$t = RC \qquad \text{[Equation 5]}$$

As a result, when the reference voltage Vref and the output voltage (Vout) are the same according to equation (5), they can be obtained as a relational expression of 'R' and 'C' corresponding to a time constant of the filter, and in this case, the time constant of the filter can be corrected by changing the capacitance (C).

Herein, the capacitor unit 223 of the capacitor compensation unit 220 has such a structure that the fourth switch SW24 is turned on so that the basic capacitor Cdef and the fourth capacitor Cb24 of the switching capacitor-bank 224 can be connected in parallel.

In addition, in order to increase the capacitance of the capacitors, more switches and capacitors can be additionally connected in parallel as necessary in the switching-capacitor bank 224.

Herein, if the voltage Vout generated according to the total composite capacitance of the capacitor unit 223 becomes greater than the reference voltage Vref, switching is corrected so that the capacitance of the capacitor unit 223 can be increased by the up/down counter unit 222. Meanwhile, if the voltage Vout generated from the total composite capacitance of the capacitor unit 223 becomes smaller than the reference voltage Vref, switching is corrected so that the capacitance of the capacitor unit 223 can be reduced by the up/down counter unit 222 of the capacitor compensation unit 220.

Through the process, the second switch S2 is turned off, while the third switch S3 is turned on.

That is, in the present invention, a tuning time for correcting a change in the cut-off frequency of the filter is based on the t(R×C) and T (external clock period), and when the input voltage (IN), the comparison target of the comparators 211 and 221, and the voltage charged in the capacitor unit 223 are controlled to be the same, t(R×C)=T (external clock period), thereby performing tuning.

In this manner, when t=T, it can be tuned to the clock period 'T', namely, an absolute external reference that is not related to the PVT (Process, Voltage and Temperature). Accordingly, any chip can be tuned to the clock period 'T', so every chip can have a uniform time constant.

Figure 3:
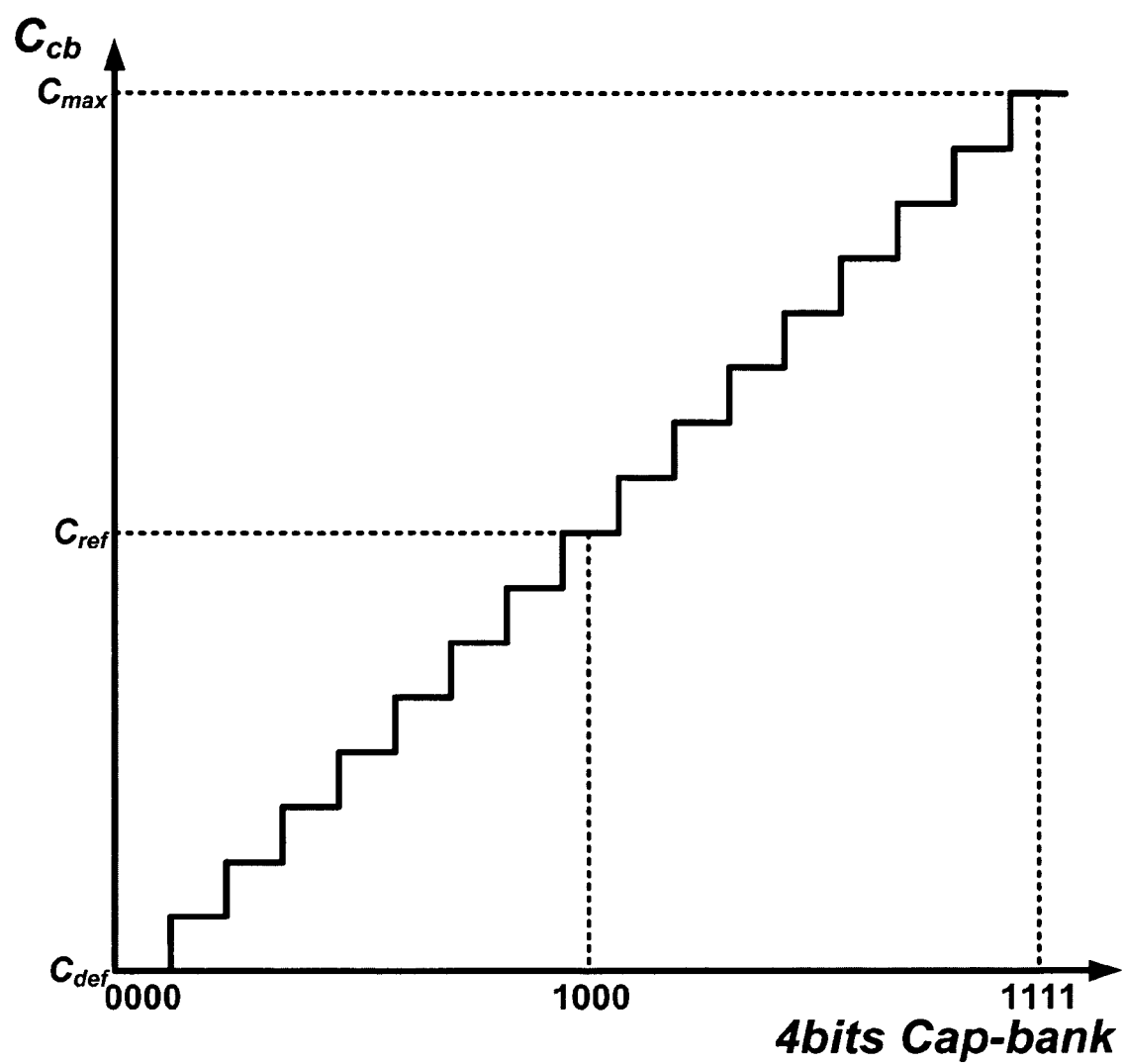
FIG. 3 is a graph showing a relationship between a control signal and capacitance according to switching controlling of a switching capacitor-bank of the tuning circuit for compensating a change in the cut-off frequency of the filter according to the exemplary embodiment of the present invention.

FIG. 3 is a graph showing the relationship between the control signal and the capacitance according to switching controlling of the switching capacitor-bank of the tuning circuit for compensating a change in the cut-off frequency of the filter according to the exemplary embodiment of the present invention.

As shown in FIG. 3, capacitance is determined according to a control bit signal generated from the up/down counter unit 222. A control bit signal [1000] of the 4-bit capacitor unit is initially set as a reference capacitance (Cref), and a control signal is generated to increase or decrease the capacitance.

Namely, in order to reduce the capacitance, the reference control bits [1000] are reduced to [0000], and in order to increase the capacitance, the reference control bits [1000] are increased to [1111]. Accordingly, the capacitance is changed.

Figure 4:
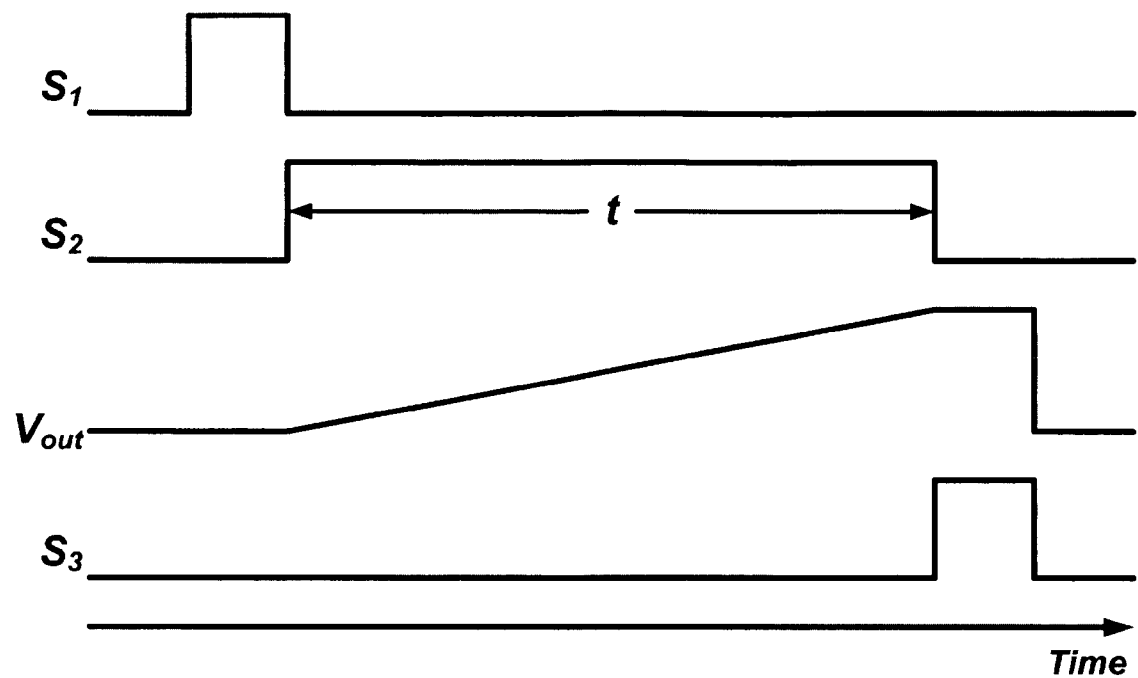
FIG. 4 shows clock signals applied to the tuning circuit for compensating the change in the cut-off frequency of the filter according to the exemplary embodiment of the present invention.

FIG. 4 is a time chart showing a general operation of the tuning circuit over time for compensating a change in the cut-off frequency of the filter according to the exemplary embodiment of the present invention.

As illustrated, a signal for indicating a start of compensation of capacitance is defined as S1, a signal for indicating correction of capacitance is defined as S2, a signal for indicating completion of correction of capacitance is defined as S3, and an output voltage is defined as Vout.

That is, correcting of capacitance starts according to the signal S1, capacitance is corrected according to the signal S2 during a certain time (t), and when the output voltage (Vout) close to the reference voltage is sustained for a certain time, the correction of the capacitance is completed according to the signal S3.

Herein, S1 is a switching operation for discharging the capacitor unit, S2 is a switching operation for operating a capacitor correction unit, and S3 is a switching operation for correcting capacitance by the up/down counter unit.

That is, according to the present invention, the time constant can be corrected by correcting capacitance.

As described above, when the cut-off frequency is changed due to a change in the characteristics of the filter by more than a certain range compared with the characteristics of the filter set when the filter is initially designed, the changed characteristics of the filter can be compensated by using the tuning circuit.

In addition, because it can be tuned with the clock period that is not related to an external channel, the tuning effect can be maximized.

Moreover, because it can be tuned with the clock period that is not related to an external change regardless of a type of a chip, every chip of the tuning circuit can have the uniform R*C value.

What is claimed is:

1. A tuning circuit comprising:
   a current generation unit comprising a first transistor having three terminals and changing a current flowing from a second terminal to a third terminal in proportion to a voltage applied to a first terminal, and a resistor being connected in series with the first transistor, a current flowing at the resistor being changed according to a resistance of the resistor; and
   a capacitor compensation unit comprising a second transistor having three terminals and constituting a current-mirror circuit together with the second transistor in which a mirror-current flows from a fifth terminal to a sixth terminal in proportion to a voltage applied to a forth terminal, a capacitor unit being connected with the sixth terminal of the second transistor and varying capacitance (C) of a capacitor with an time constant (RC), and an up-down counter unit for transmitting a control signal to vary the capacitance of the capacitor unit.

2. The circuit of claim 1, further comprising:
   a first comparator comparing a voltage applied to both ends of the resistor and a reference voltage and outputting it, and the output of the first comparator is applied to the first terminal of the first transistor.

3. The circuit of claim 2, wherein the resister of the current generation unit comprises two or more resistors connected in parallel and one of them is activated by a control mode clock signal according to a wideband frequency.

4. The circuit of claim 2, further comprising:
   a second comparator for comparing an output voltage of the capacitor compensation unit and a reference voltage and outputting a signal of a comparison value, and the output signal of the second comparator is applied as an input signal of the up-down counter unit.

5. The circuit of claim 4, wherein the capacitor unit comprises a plurality of capacitors connected in parallel and each capacitor is connected with a switch, forming a switching capacitor structure, and the switch is controlled by a digital 4-bit control signal of the up-down counter unit.

6. The circuit of claim 4, further comprising:
   a first switch being connected between an output terminal of the capacitor compensation unit and a ground;
   a second switch being connected between the sixth terminal of the second transistor and the output terminal of the capacitor compensation unit; and
   a third switch being connected between an input terminal of the second comparator and an output terminal of the capacitor compensation unit.

7. The circuit of claim 6, wherein the first to third switches are controlled by clock signals, and when the first switch is turned on by a first clock signal, the second and third switches are sustained in an OFF state, when the second switch is turned on by a second clock signal, the first and third switches is sustained in an OFF state, and when the third switch is turned on by a third clock signal, the first and second switches can be sustained in an OFF state.

* * * * *